United States Patent
Zheng et al.

(10) Patent No.: US 6,251,747 B1
(45) Date of Patent: Jun. 26, 2001

(54) USE OF AN INSULATING SPACER TO PREVENT THRESHOLD VOLTAGE ROLL-OFF IN NARROW DEVICES

(75) Inventors: Tammy Zheng, Fremont; Faran Nouri, Los Altos, both of CA (US)

(73) Assignee: Philips Semiconductors, Inc., Tarrytown, NY (US)

( * ) Notice: Subject to any disclaimer, the term of this patent is extended or adjusted under 35 U.S.C. 154(b) by 0 days.

(21) Appl. No.: 09/432,666

(22) Filed: Nov. 2, 1999

(51) Int. Cl.[7] .................................................. H01L 21/76
(52) U.S. Cl. ......................... 438/424; 438/221; 438/296; 438/426; 257/510
(58) Field of Search ............................... 438/221, 296, 438/424, 426, 359; 257/510

(56) References Cited

U.S. PATENT DOCUMENTS

| | | | |
|---|---|---|---|
| 5,741,738 | * 4/1998 | Mandelman et al. | 438/296 |
| 5,882,982 | 3/1999 | Zheng et al. . | |
| 5,882,983 | * 3/1999 | Gardner et al. | 438/296 |
| 5,918,131 | * 6/1999 | Hsu et al. | 438/296 |
| 5,950,090 | * 7/1999 | Chen et al. | 438/296 |
| 5,960,297 | * 9/1999 | Saki | 438/424 |
| 5,966,615 | 10/1999 | Fazan et al. . | |
| 6,005,279 | * 12/1999 | Luning | 257/510 |
| 6,054,343 | * 4/2000 | Ashburn | 438/221 |

FOREIGN PATENT DOCUMENTS

| | | |
|---|---|---|
| 224039 | 6/1987 | (EP) . |
| 11-284064 | 10/1999 | (JP) . |

* cited by examiner

*Primary Examiner*—Charles Bowers
*Assistant Examiner*—David S Blum
(74) *Attorney, Agent, or Firm*—Peter Zawilski

(57) ABSTRACT

A method of forming a semiconductor device minimizes oxide recessing in a trench of a semiconductor device. In one embodiment, forming a nitride spacer surrounding the top trench corner oxide in a shallow trench isolation region protects the corner oxide from being etched during processing. Oxide recessing in the trench is undesirable since it results in high electric fields around the sharp top corners of the trenches and $V_t$ roll-off of the transistors. According to one example embodiment, STI regions filled with an HDP oxide and having undergone planarization, are masked. The masking substantially covers the HDP oxide and overlaps at least portions of nitride regions. Unmasked areas of the nitride regions are etched away forming nitride spacers on both sides of the HDP oxide fill.

15 Claims, 3 Drawing Sheets

USE OF AN INSULATING SPACER TO PREVENT THRESHOLD VOLTAGE ROLL-OFF IN NARROW DEVICES

FIELD OF INVENTION

The present invention is generally directed to the manufacture of a semiconductor device. In particular, the present invention relates to a process to maintain the integrity of the shallow trench isolation regions during etch of the fill dielectric regions.

BACKGROUND OF INVENTION

The electronics industry continues to rely upon advances in semiconductor technology to realize higher-function devices in more compact areas. For many applications, realizing higher-functioning devices requires integrating a large number of electronic devices into a single silicon wafer. As the number of electronic devices per given area of the silicon wafer increases, the manufacturing process becomes more difficult.

A large variety of semiconductor devices has been manufactured having various applications in numerous disciplines. Such silicon-based semiconductor devices often include metal-oxide-semiconductor (MOS) transistors, such as p-channel MOS (PMOS, n-channel MOS (NMOS) and complementary MOS (CMOS) transistors, bipolar transistors, BiCMOS transistors.

Each of these semiconductor devices generally includes a semiconductor substrate on which a number of active devices are formed. The particular structure of a given active device can vary between device types. For example, in MOS transistors an active device generally includes source and drain regions and a gate electrode that modulates current between the source and drain regions.

One important step in the manufacture of such devices is the formation of isolation areas to electrically separate the electrical devices or portions thereof, that are closely integrated in the silicon wafer. While the particular structure of a given active device can vary between device types, a MOS-type transistor generally includes source and drain regions and a gate electrode that modulates current flowing in a channel between the source and drain regions. Unintended current should not flow between the source and drain regions of adjacent MOS-type transistors. However, during the manufacturing process, movement of dopant atoms, for example, of boron, phosphorus, arsenic, or antimony, can occur within the solid silicon of the wafer. This movement is referred to as diffusion. The diffusion process occurs at elevated temperatures where there is a concentration gradient between dopant atoms external to the silicon wafer and those dopant atoms within the silicon wafer. Diffusion processes at elevated temperatures are typically utilized when forming p-type and n-type regions of a silicon integrated circuit device.

A technique referred to as "trench isolation" has been used to limit such flow. A particular type of trench isolation is referred to as shallow trench isolation (STI). STI is often used to separate the respective diffusion regions of devices of the same or opposite polarity type (i.e., p-type versus n-type).

In forming the STI regions, one technique involves the layering of dielectric films on a silicon substrate. A prior art process begins with a silicon substrate, upon which a thin layer of silicon dioxide is formed. In an example process, about 100 Å of $SiO_2$ is deposited on the silicon substrate. Following the oxide deposition, a substantially thicker layer of silicon nitride is deposited upon the thin oxide layer. In the example process, the process deposits about 1800 Å silicon nitride. Through photolithography, the STI regions are masked with a photoresist. An etch selective to the $SiN/SiO_2$ stack is performed until the silicon substrate is exposed. The photoresist mask is then stripped off. Using the SiN as a mask, the process etches shallow silicon trenches into the substrate. The opened trenches typically receive a fill deposition of high-density plasma (HDP) oxide. In an example process, oxide is deposited at a thickness of between about 6000 Å to 9000 Å to fill trenches whose depths range from about 2500 Å to 3500 Å. A planarization process is then used to remove excess oxide. The remaining silicon nitride is used as an etch stop. In a modern sub-micron process, chemical-mechanical polishing (CW) is used to planarize the features.

Referring to FIG. 1A of a prior art process, the features are shown after having undergone CMP. Device 100 is formed on a substrate 110. STI regions 150 are separated by the $SiO_2/SiN$ stacks 140. The stack 140 consists of the thin oxide layer 120 and a nitride layer 130. Following the planarization, the nitride is stripped with a wet cleaning process. The areas of stripped nitride can be used to provide regions of active areas separated by STI. Next, post CMP cleaning processes and a "sacrificial oxidation" pre-clean process step followed by growth of about 200 Å to 300 Å sacrificial oxidation layer prepares the active areas of the MOS transistor structure for subsequent processing.

The preceding processes may form STI oxide recesses near the top comers of the trenches. This is a significant challenge to overcome. Referring to FIG. 1B, the oxide recesses 160 are shown. These recesses cause a $V_t$ roll-off in narrow transistors, also known as the wrap around effect, owing to the gate oxidation thinning in subsequent processing and the higher electric field around the sharp top comers of the trenches near the active area 120a. Consequently, the top comer oxide recess enhances the wrap around effect and degrades the transistor performance of a device built in the active area 120a.

Accordingly, there is a need for a process that minimines the likelihood of forming such recesses that tend to degrade transistor performance.

SUMMARY OF INVENTION

The present invention is exemplified in a number of implementations, one of which is sununarized below. The invention minimizes the formation of recesses in the STI structure during processing. According to one embodiment, a semiconductor substrate has at least one shallow trench separated from other devices by formed insulating regions, which later define active transistor areas of an integrated circuit. A method of forming an insulating spacer comprises depositing a dielectric over the substrate and substantially filling in the trench regions and covering the insulating regions. Next, the method planarizes the dielectric so that it is substantially flush with the insulating regions. The insulating regions are formed by masking the dielectric disposed over the trench regions substantially covering the dielectric and overlapping at least a portion of the insulating regions. Unmasked portions of the insulating regions are removed and the insulating spacers remain. The unmasked portions of the insulating regions define the active transistor areas. Next, the active transistor areas are cleaned and a sacrificial oxide layer is grown therein. After growing the sacrificial oxide layer, the insulating spacers are removed.

The above summary of the present invention is not intended to represent each disclosed embodiment, or every aspect, of the present invention. Other aspects and example embodiments are provided in the figures and the detailed description that follows.

BRIEF DESCRIPTION OF THE DRAWINGS

The invention may be more completely understood in consideration of the following detailed description of various embodiments of the invention in connection with the accompanying drawings, in which:

FIGS. 2A–2D illustrate in cross-section a process according to an embodiment of the present invention, wherein:

FIG. 2A illustrates in cross-section a substrate with STI regions defined and planarized;

FIG. 2B depicts the cross-section of FIG. 2A with a photo-mask to define the nitride spacers;

FIG. 2C illustrates the structure of FIG. 2B after a removal of unmasked nitride leaving the nitride spacers; and FIG. 2D illustrates the structure of FIG. 2C after the removal of the nitride spacers in another example embodiment, according to the present invention.

Figure 1A:
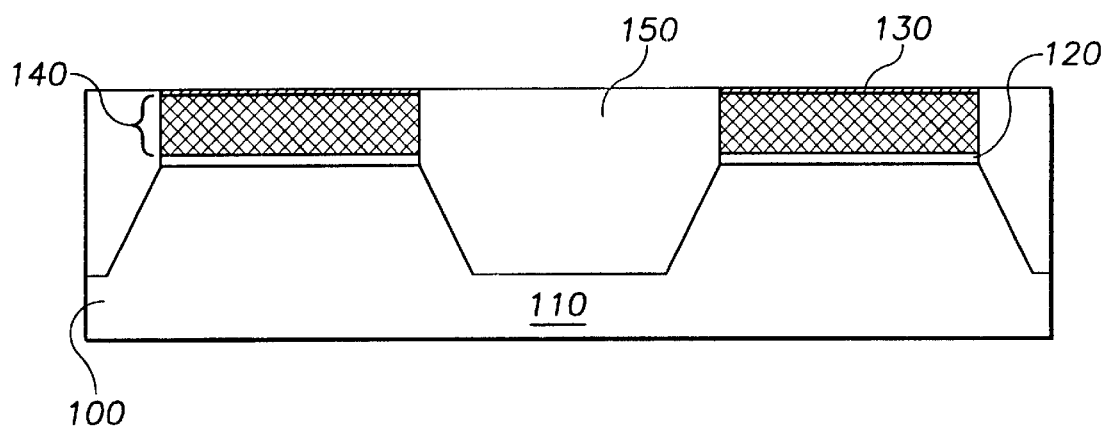
FIG. 1A illustrates in cross-section a prior art process having STI regions after CMP.
Figure 1B:
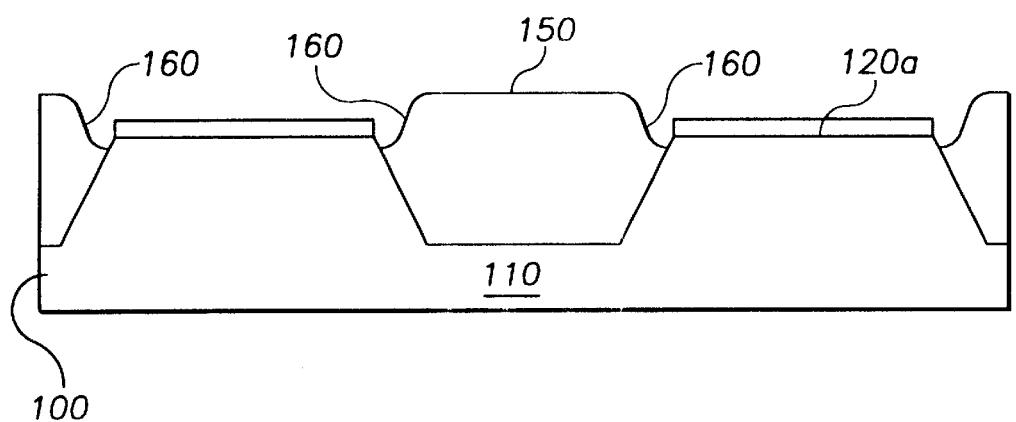
FIG. 1B shows the structure of FIG. 1A after the pre-clean/sacrificial oxide and formation of recesses.

While the invention is susceptible to various modifications and alternative forms, specific embodiments thereof have been shown by way of example in the drawings and will herein be described in detail. It should be understood, however, that it is not intended to limit the invention to the particular forms disclosed, but on the contrary, the intention is to cover all modifications, equivalents, and alternatives falling within the spirit and scope of the invention as defined by the appended claims.

DETAILED DESCRIPTION

The present invention has been found to be useful and advantageous in connection with etch processes used to manufacture MOS-type transistors. The present invention has been found to be particularly useful where it is advantageous to minimize the likelihood of etching the thin regions at the top corners of the trenches. Also the invention is particularly useful in controlling the threshold voltage and leakage of narrow transistors. In the discussion that follows, a MOS structure is used to describe an example implementation of the invention. However, the invention is not necessarily so limited.

In a silicon substrate, a process forms trench isolation regions as has been described in the Background discussion. CMP has smoothed out the surface topography of the structure and the structure is prepared for subsequent processing. Areas in which the trench oxide is present are masked. A photo mask covers the oxide and overlaps a width of the surrounding nitride. Etching removes the unmasked nitride. The trenches are protected because they are surrounded by the nitride ($Si_xN_y$) spacers. Other materials may be substituted for silicon nitride in forming protective spacers. These materials include siliconrich oxide ($Si_xO_y$) or silicon oxy-nitride ($Si_xO_yN_z$). The top corners of the trenches are protected from subsequent etch processes by the nitride spacers. The present invention is applicable in a trench isolation method such as that outlined in U.S. Pat. No. 5,882,982, entitled "Trench Isolation Method," issued on Mar. 16, 1999, assigned to the instant assignee and herein incorporated by reference in its entirety.

Referring to FIGS. 2A–2D, in an example process according to the present invention, nitride spacers to protect the top corners of the STI oxide are illustrated. Specifically, in FIG. 2A, a structure 200 has a silicon substrate 210. On the substrate 210, dielectric stacks 240 of a thin oxide 220 and a substantially thicker silicon nitride 230 bound the regions of shallow trench isolation 250. HDP (High Density Plasma) oxide fills the shallow trench isolation 250. The oxide fill of the shallow trench isolation may be accomplished with another technique, such as low-pressure chemical vapor deposition (LPCVD). After the oxide fill is deposited, the surface 200 of the structure undergoes CMP plananrzaon.

Figure 2A:
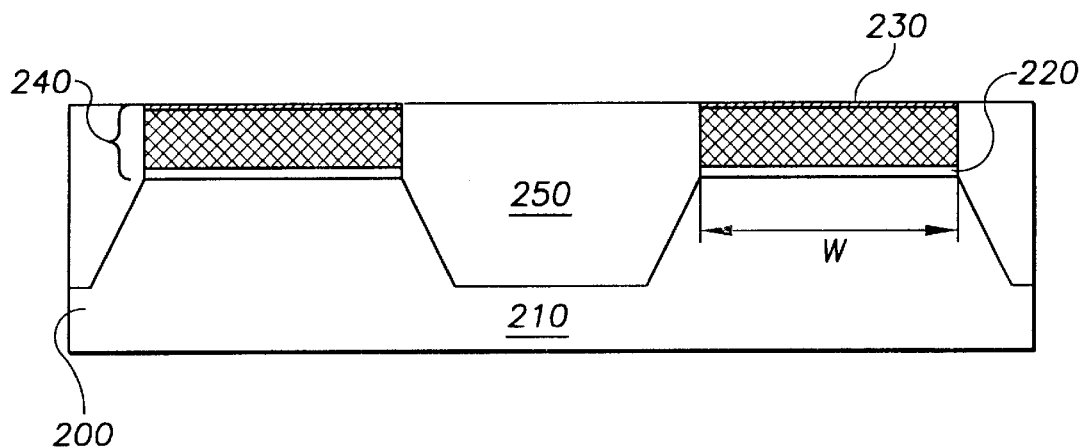
Figure 2B:
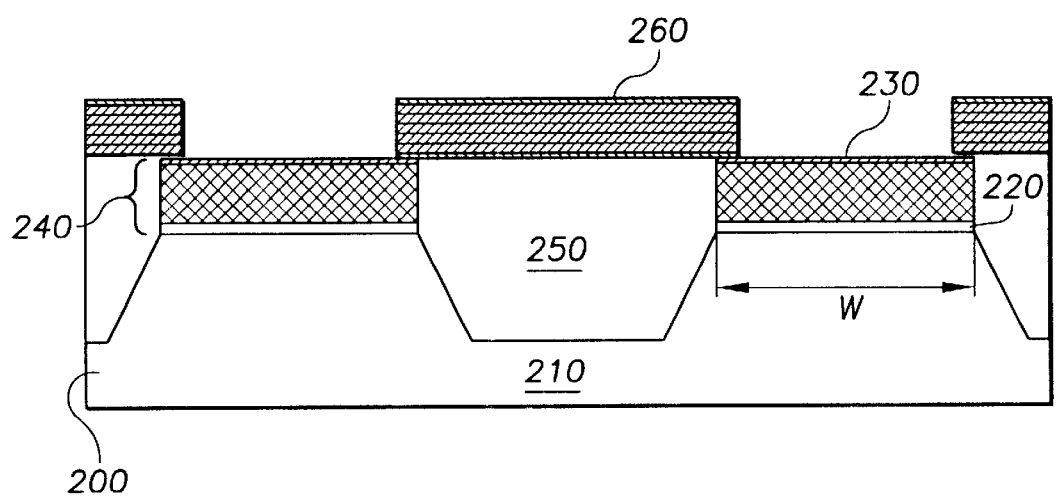
Figure 2C:
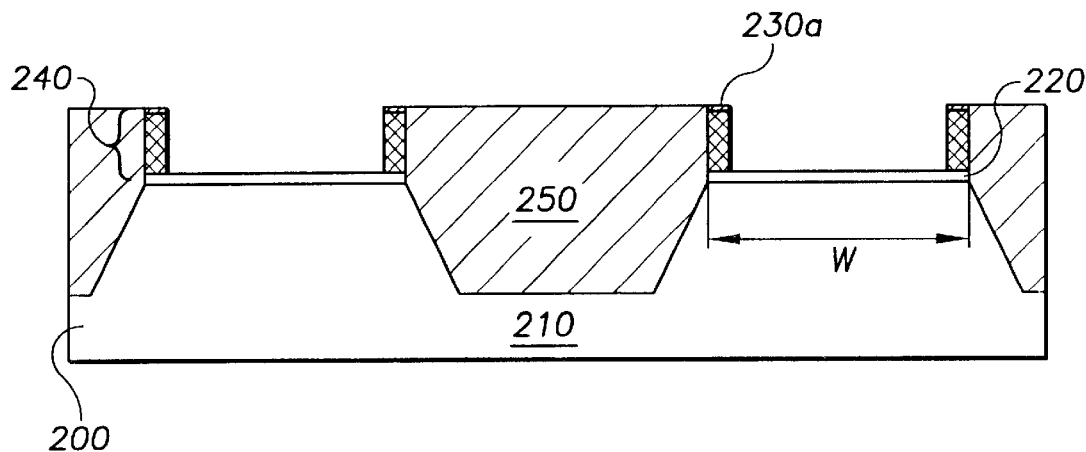

Referring to FIG. 2B, a photoresist 260 masks STI regions 250. The photo resist 260 covers the STI region 250 and overlaps the nitride 230 adjacent to trench 250. In a modern sub-micron process, the overlap is in the range of about 0.05 $\mu$m to 0.20 $\mu$m, or about 0.10 $\mu$m to 0.15 $\mu$m. The overlap is sufficient to make an effective protective barrier yet, not consume channel width W (as shown) of the subsequently formed active transistor area. Referring to FIG. 2C, conventional photolithography forms the nitride spacers 230a from the nitride layer 230 of FIG. 2B. Unmasked areas of nitride 230 may be removed by a plasma etch process selective to nitride. The nitride-selective etch stops on the thin oxide region 220. The nitride spacers 230a protect the top corners of the STI from attack by wet processes. For example, in a modem sub-micron process, after the nitride spacer 230a has been formed, a silicon substrate 210 may undergo a hydrofluoric acid dip and a pre-cleaning process. A sacrificial oxide growth of about 200 82 to 250 $\mu$ at 950 °C , in a wet or dry ambient prepares the active transistor areas for subsequent processing.

Figure 2D:
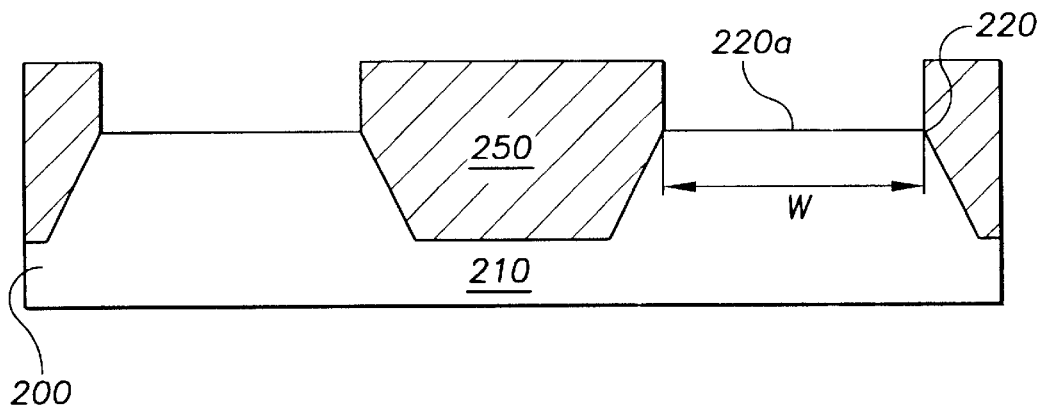

As depicted in FIG. 2D, etching of the unmasked regions of the device structure 200 results in active areas 220a of width W, separated by the STI regions 250 having nitride spacers 230a.

In some modern sub-micron processes, the consumption of device width may be significant if the nitride spacers remain. Consequently, in an alternative embodiment shown in FIG. 2D, the nitride spacer 230a may be removed by a wet etch of hot phosphoric acid after the silicon substrate 210 completes the HF dip, pre-cleaning, and sacrificial oxide growth process. Using spacers, according to the present invention, protects the corners of the STI regions from recessing. Having protected corners minimizes the transistor $V_t$ rolloff effect that degrades transistor performance. Consequently, as individual transistor performance is improved, the overall device and wafer yield increase.

While the present invention has been described with reference to several particular example embodiments, those skilled in the art will recognize that many changes may be made thereto without departing from the spirit and scope of the present invention, which is set forth in the following claims.

What is claimed:

1. In a semiconductor substrate having at least one shallow trench region separated by insulating regions, a method of forming an insulating spacer, comprising:

depositing a dielectric over the substrate and substantially filling the trench region and covering the insulating regions;

planarizing the dielectric so that the dielectric is substantially flush with the insulating regions;

masking the dielectric disposed over the trench regions, substantially covering the dielectric and overlapping at least a portion of the insulating regions; and removing the unmasked portions of the insulating regions, and forming the insulating spacers.

2. The method as recited in claim 1 wherein planarizing the dielectric is by chemical mechanical polishing.

3. The method as recited in claim 1
wherein the dielectric is selected from at least one of the following: $Si_xO_y$ and $Si_xO_yN_z$; and
wherein the insulating region is selected from at least one of the following: $Si_nN_y$, $Si_xO_y$ and $Si_xO_yN_z$.

4. The method as recited in claim 1 wherein the masking further comprises:
depositing a photo resist on the dielectric disposed over the trench regions, overlapping at least a portion of the insulating regions, exposing the photo resist to light;
developing the photo resist;
removing uncovered portions of the insulating regions; and
stripping the photo resist.

5. The method as recited in claim 1 wherein removing the unmasked portions of the insulating regions is an etch process selected from at least one of the following: a plasma etch and a wet etch.

6. A method of forming a shallow trench isolation region, in a semiconductor substrate having a dielectric spacer comprising:
forming at least one trench, in the semiconductor substrate having a nitride region thereon, the trench defined in the nitride region and within the semiconductor substrate;
depositing a dielectric over the semiconductor substrate substantially filling the trench with the dielectric;
planarizing the dielectric so the dielectric is substantially flush with the nitride region;
masking the dielectric disposed over the trench, substantially covering the dielectric and overlapping at least a portion of the nitride region; and
removing the unmasked portions of the nitride region, and forming a nitride spacer.

7. The method as recited in claim 6 wherein the dielectric is selected from at least one of the following: $SiO_y$ and $Si_xO_yN_z$.

8. The method as recited in claim 6 wherein planarizing the dielectric is by chemical mechanical polishing.

9. The method as recited in claim 6 wherein removing the unmasked portions of the nitride region is via an etch process selected from at least one of the following: a plasma etch and a wet etch.

10. The method as recited in claim 6 wherein the masking further comprises:
depositing a photo resist on the dielectric disposed over the trench regions, overlapping at least a portion of the insulating regions, exposing the photo resist to light;
developing the photo resist;
removing uncovered portions of the insulating regions; and
stripping the photo resist.

11. In a semiconductor substrate having at least one shallow trench region separated by insulating regions, a method of protecting the shallow trench region from dielectric recessing, comprising:
depositing a dielectric over the substrate and substantially filling the trench region and covering the insulating regions;
planarizing the dielectric so that the dielectric is substantially flush with the insulating regions;
masking the dielectric disposed over the trench regions, substantially covering the dielectric and overlapping at least a portion of the insulating regions;
removing the unmasked portions of the insulating regions, forming insulating spacers, the unmasked portions of the insulating regions defining active transistor areas therein; and
cleaning the active transistor areas and growing a sacrificial oxide layer in the active transistor areas; and
removing the insulating spacers.

12. The method as recited in claim 11 wherein planarizing the dielectric is by chemical mechanical polishing.

13. The method as recited in claim 11
wherein the dielectric is selected from at least one of the following: $Si_xO_y$ and $Si_xO_yN_z$; and
wherein the insulating region is selected from at least one of the following: $Si_xN_y$, $Si_xO_y$ and $Si_xO_yN_z$.

14. The method as recited in claim 11 wherein the masking further comprises:
depositing a photo resist on the dielectric disposed over the trench regions, overlapping at least a portion of the insulating regions, exposing the photo resist to light;
developing the photo resist;
removing uncovered portions of the insulating regions; and
stripping the photo resist.

15. The method as recited in claim 11,
wherein removing the unmasked portions of the insulating regions is with an etch process selected from at least one of the following: a plasma etch and a wet etch; and
wherein the removing of the insulating spacers is with an etch process selected from at least one of the following: a plasma etch and a wet etch.

* * * * *

UNITED STATES PATENT AND TRADEMARK OFFICE
CERTIFICATE OF CORRECTION

PATENT NO. : 6,251,747 B1
DATED : June 26, 2001
INVENTOR(S) : Zheng et al.

Page 1 of 1

It is certified that error appears in the above-identified patent and that said Letters Patent is hereby corrected as shown below:

Column 5,
Line 9, "$Si_nN_y$" should read -- $Si_xN_y$ --.
Line 42, "$SiO_y$" should read -- $Si_xO_y$ --.

Signed and Sealed this

Thirtieth Day of April, 2002

Attest:

Attesting Officer

JAMES E. ROGAN
*Director of the United States Patent and Trademark Office*